US012671414B2

(12) United States Patent
Shah et al.

(10) Patent No.: US 12,671,414 B2
(45) Date of Patent: Jun. 30, 2026

(54) FAST DISCHARGE CIRCUIT

(71) Applicant: TEXAS INSTRUMENTS INCORPORATED, Dallas, TX (US)

(72) Inventors: Avinash Shah, Jharsuguda (IN); Kashyap Barot, Bengaluru (IN); Sreeram Nasum S, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 465 days.

(21) Appl. No.: 18/194,267

(22) Filed: Mar. 31, 2023

(65) Prior Publication Data

US 2024/0195409 A1 Jun. 13, 2024

(30) Foreign Application Priority Data

Dec. 13, 2022 (IN) .............................. 202241071844

(51) Int. Cl.
*H03K 17/687* (2006.01)
*H02M 1/32* (2007.01)

(52) U.S. Cl.
CPC ........ *H03K 17/6871* (2013.01); *H02M 1/322* (2021.05)

(58) Field of Classification Search
CPC .. H02M 1/322; H03K 17/687; H03K 17/6871
USPC .................................. 320/166; 327/574, 581
See application file for complete search history.

(56) References Cited

U.S. PATENT DOCUMENTS

| | | | | |
|---|---|---|---|---|
| 4,536,693 A * | 8/1985 | Marek | ..................... | F42C 11/00 |
| | | | | 307/140 |
| 6,424,125 B1 * | 7/2002 | Graham | ................... | H02H 3/14 |
| | | | | 320/166 |
| 8,624,562 B2 * | 1/2014 | Balakrishnan | .......... | H02M 1/32 |
| | | | | 320/166 |
| 8,937,471 B2 * | 1/2015 | Kobayashi | .............. | H02M 1/32 |
| | | | | 363/125 |
| 2010/0277146 A1 * | 11/2010 | Zhou | ......................... | G06F 1/24 |
| | | | | 713/300 |

* cited by examiner

*Primary Examiner* — William Hernandez
(74) *Attorney, Agent, or Firm* — Xianghui Huang; Frank D. Cimino

(57) ABSTRACT

A circuit incudes: a first transistor; a capacitor; a second transistor; and a second resistor. The first transistor has a current terminal and a first control terminal. The capacitor has a capacitor terminal coupled to the current terminal of the first transistor. The second transistor has a first current terminal, a second current terminal, and a second control terminal. The first current terminal of the second transistor is coupled to the capacitor terminal. The second current terminal of the second transistor is coupled to the first control terminal. The resistor has a resistor terminal coupled to the second control terminal.

16 Claims, 6 Drawing Sheets

EXAMPLE VALUES $C_{dis}$ = 5pF
C2 = 200fF
C3 = 1pF
$R_{dis}$ = 25kΩ
R4 = 50kΩ
R5 = 10kΩ
R6 = 25kΩ

FAST DISCHARGE CIRCUIT

CROSS REFERENCE TO RELATED APPLICATION

The present application is related to: India Provisional Application No. 202241071844, titled "Fast discharge circuit for input current operated Opto emulator", filed on Dec. 13, 2022, which is hereby incorporated by reference in its entirety.

BACKGROUND

An optocoupler transfers an electrical signal between two isolated circuits based on: 1) a transmitter with a light source; and 2) a receiver with a photodetector. The light source may be, for example, a light-emitting diode (LED). An optoemulator emulates the operations of an optocoupler without the light source and photodetector. Efforts to reduce jitter and improve the speed of optoemulators are ongoing.

SUMMARY

In an example, circuit incudes: a first transistor; a capacitor; a second transistor; and a second resistor. The first transistor has a current terminal and a first control terminal. The capacitor has a capacitor terminal coupled to the current terminal of the first transistor. The second transistor has a first current terminal, a second current terminal, and a second control terminal. The first current terminal of the second transistor is coupled to the capacitor terminal. The second current terminal of the second transistor is coupled to the first control terminal. The resistor has a resistor terminal coupled to the second control terminal.

In another example, a circuit includes: transmitter circuitry; a transformer coupled to the transmitter circuitry; and a discharge circuit coupled to the transmitter circuitry. The discharge circuit includes: a first transistor having a current terminal and a first control terminal; a capacitor having a capacitor terminal coupled to the current terminal; and a second transistor having a first current terminal, a second current terminal, and a second control terminal; and a resistor. The first current terminal of the second transistor is coupled to the capacitor terminal. The second current terminal of the second transistor is coupled to the first control terminal. The resistor has a resistor terminal coupled to the second control terminal.

In yet another example, a circuit includes: a discharge switch; and control circuitry coupled to the discharge circuit. The control circuitry is configured to: perform first voltage level adjustments of the control circuit responsive to a control signal having a first state; control the discharge switch responsive to the control signal having a second state and the adjusted voltage levels; and perform second voltage level adjustments of the control circuit after a discharge interval is complete.

DETAILED DESCRIPTION

Figure 1:
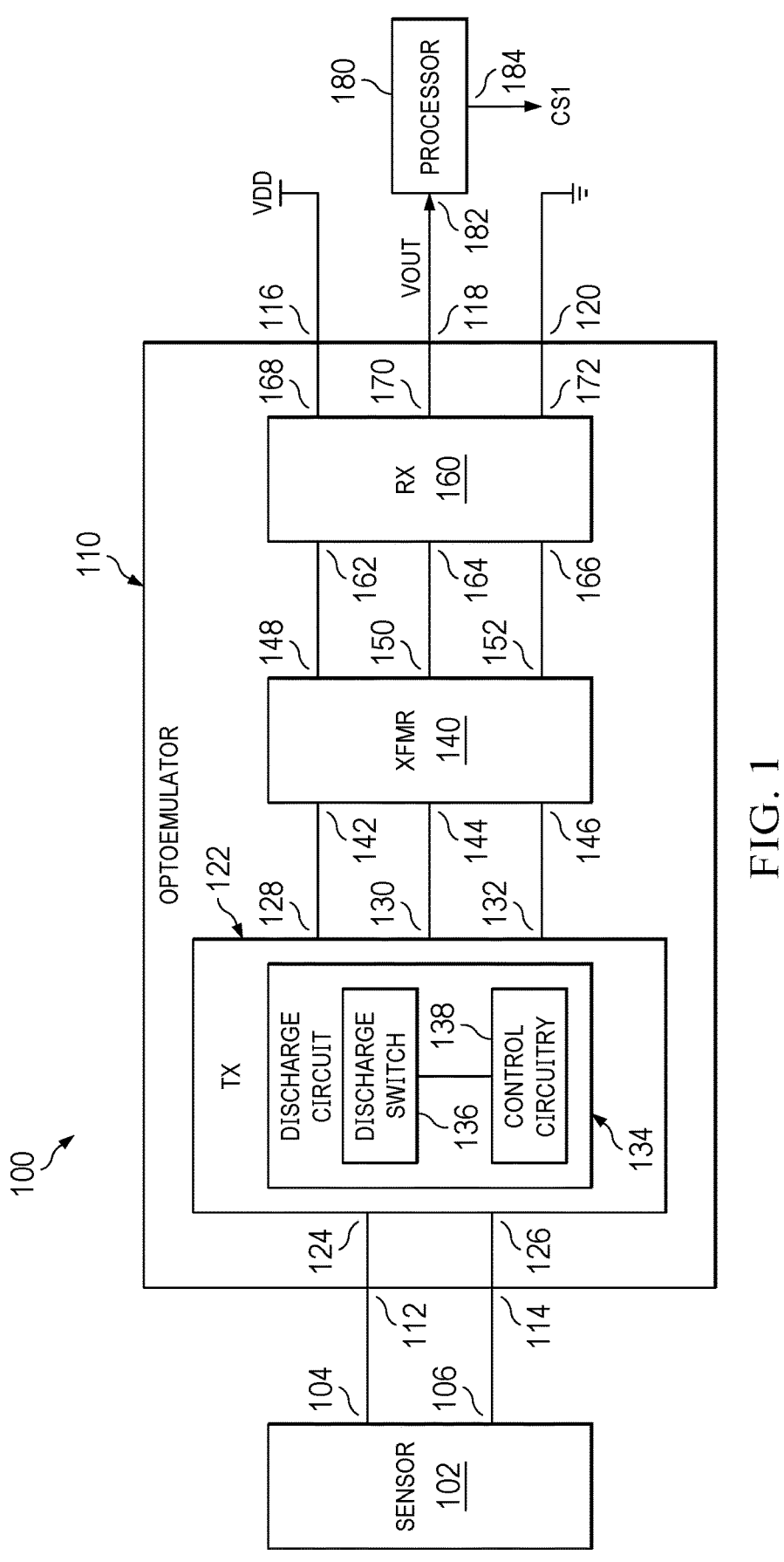
FIG. 1 is a block diagram showing an example system.

The same reference numbers or other reference designators are used in the drawings to designate the same or similar features. Such features may be the same or similar either by function and/or structure.

In the described examples, a discharge circuit includes a discharge switch and control circuitry. In some examples, the control circuitry operates to: perform first voltage level adjustments of the control circuitry responsive to a control signal having a first state; control the discharge switch responsive to the control signal having a second state and the adjusted voltage levels; and perform second voltage level adjustments of the control circuitry after a discharge interval is complete. The operations of the discharge circuit are repeated as needed to control rising and falling edges of a target signal. In some examples, the discharge circuit is part of an optoemulator transmitter. In such examples, the target signal may be a bias voltage and the control signal is an input current. With the discharge circuit, target signal jitter is reduced and the speed of target signal transitions (e.g., high-to-low transitions) is increased. These improvements improve the data rate and signal quality of communication circuitry such as an optoemulator transmitter.

FIG. 1 is a block diagram showing an example system. In some examples, the system 100 is a programmable logic controller (PLC) signal or a servo drive system. As shown, the system 100 includes a sensor 102, an optoemulator 110, and a processor 180. In some examples, the sensor 102 may be a pulse encoder. In some examples, system 100 may include multiple sensors and optoemulators. In such examples, each sensor may have its own optoemulator to transfer sensor data to the processor 180. As another option, multiple sensors may share an optoemulator. As another option, the system 100 may include multiple processors.

In the example of FIG. 1, the sensor 102 has a first terminal 104 and a second terminal 106. The optoemulator 110 has a first terminal 112, a second terminal 114, a third terminal 116, a fourth terminal 118, and a fifth terminal 120. The processor 180 has a first interface 182 and a second interface 184. As shown, the optoemulator 110 includes a transmitter 122, a transformer 140, and a receiver 160. The transmitter 122 has a first terminal 124, a second terminal 126, a third terminal 128, a fourth terminal 130, and a fifth terminal 132. In the example of FIG. 1, the transmitter 122 includes a discharge circuit 134. The discharge circuit 134 includes a discharge switch 136 and control circuitry 138. The transformer 140 has a first terminal 142, a second terminal 144, a third terminal 146, a fourth terminal 148, a fifth terminal 150, and a sixth terminal 152. The receiver 160 has a first terminal 162, a second terminal 164, a third terminal 166, a fourth terminal 168, a fifth terminal 170, and a sixth terminal 172.

In the example of FIG. 1, the first terminal 112 of the optoemulator 110 is coupled to the first terminal 104 of the sensor 102. The second terminal 114 of the optoemulator 110 is coupled to the second terminal 106 of the sensor 102. The third terminal 116 (e.g., a voltage supply terminal) of the optoemulator 110 is coupled to a power supply VDD source to receive a supply voltage (VDD). The fourth terminal 118 of the optoemulator 110 is coupled to the first interface 182 of the processor 180. The fifth terminal 120 of the optoemulator 110 is coupled to a ground terminal to be electrically grounded.

The first terminal 124 of the transmitter 122 is coupled to the first terminal 112 of the optoemulator 110. The second terminal 126 of the transmitter 122 is coupled to the second terminal 114 of the optoemulator 110. The third terminal 128 of the transmitter 122 is coupled to the first terminal 142 of the transformer 140. The fourth terminal 130 of the trans- mitter 122 is coupled to the second terminal 144 of the transformer 140. The fifth terminal 132 of the transmitter 122 is coupled to the third terminal 146 of the transformer 140. The first terminal 162 of the receiver 160 is coupled to the fourth terminal 148 of the transformer 140. The second terminal 164 of the receiver 160 is coupled to the fifth terminal 150 of the transformer 140. The third terminal 166 of the receiver 160 is coupled to the sixth terminal 152 of the transformer 140. The fourth terminal 168 of the receiver 160 is coupled to the third terminal 116 of the optoemulator 110. The fifth terminal 170 of the receiver 160 is coupled to the fourth terminal 118 of the optoemulator 110. The sixth terminal 172 of the receiver 160 is coupled to the fifth terminal 120 of the optoemulator 110.

In some examples, the sensor 102 operates to generate or modulate a current responsive to an ambient parameter sensed by the sensor 102. The optoemulator 110 operates to: receive the current generated or modulated by the sensor 102; generate a bias voltage ($V_{bias}$) responsive to the received current; control $V_{bias}$ based on the operations of the discharge circuit 134 and possibly other circuits; use $V_{bias}$ to generate a transmit signal; use the transformer 140 to pass the transmit signal to the receiver 160; use the receiver 160 to provide an output voltage (VOUT) responsive to the transmit signal and VDD. The processor 180 operates to: store, analyze, and/or modify the VOUT results provided by the optoemulator 110; and provide a control signal (CS1) responsive to the VOUT results and operations of the processor 180. With the optoemulator 110, the sensor 102 is isolated from the processor 180. Without limitation to other examples, the sensor 102 may be a motor position sensor and the processor determines phase currents for the motor responsive to the sensed position and/or other control parameters.

In some examples, the discharge circuit 134 is configured to discharge $V_{bias}$ (e.g., transition $V_{bias}$ from a logical 1 level or high state to a logical 0 level or low state) via the discharge switch 136 responsive to the current received by the optoemulator 110 having a second state. The control circuitry 138 is coupled to the discharge circuit and is configured to: perform first voltage level adjustments of the control circuit responsive to a control signal (e.g., the received current) having a first state; control the discharge switch responsive to the control signal having a second state and responsive to the adjusted voltage levels; and perform second voltage level adjustments of the control circuit after a discharge interval is complete. In some examples, the control circuitry includes a capacitor, a first control switch, and a second control switch. In such examples, the first voltage level adjustments may include charging the capaci- tor via the first control switch, and the second voltage level adjustments include discharging the capacitor via the second control switch. In some examples, the discharge switch has a control terminal, the control circuitry includes a third control switch, and the second voltage level adjustments include discharging charge at the control terminal via the third control switch. Other first voltage level adjustments may include turning on a transistor M9 to discharge a capacitor $C_{dis}$ responsive to a pd node going high and responsive to a delay (e.g, FIG. 4). Other second voltage level adjustments may include turning on a transistor M11 to discharge a residual voltage at the pd node responsive to low-to-high transitions (e.g., FIG. 4).

Figure 2:
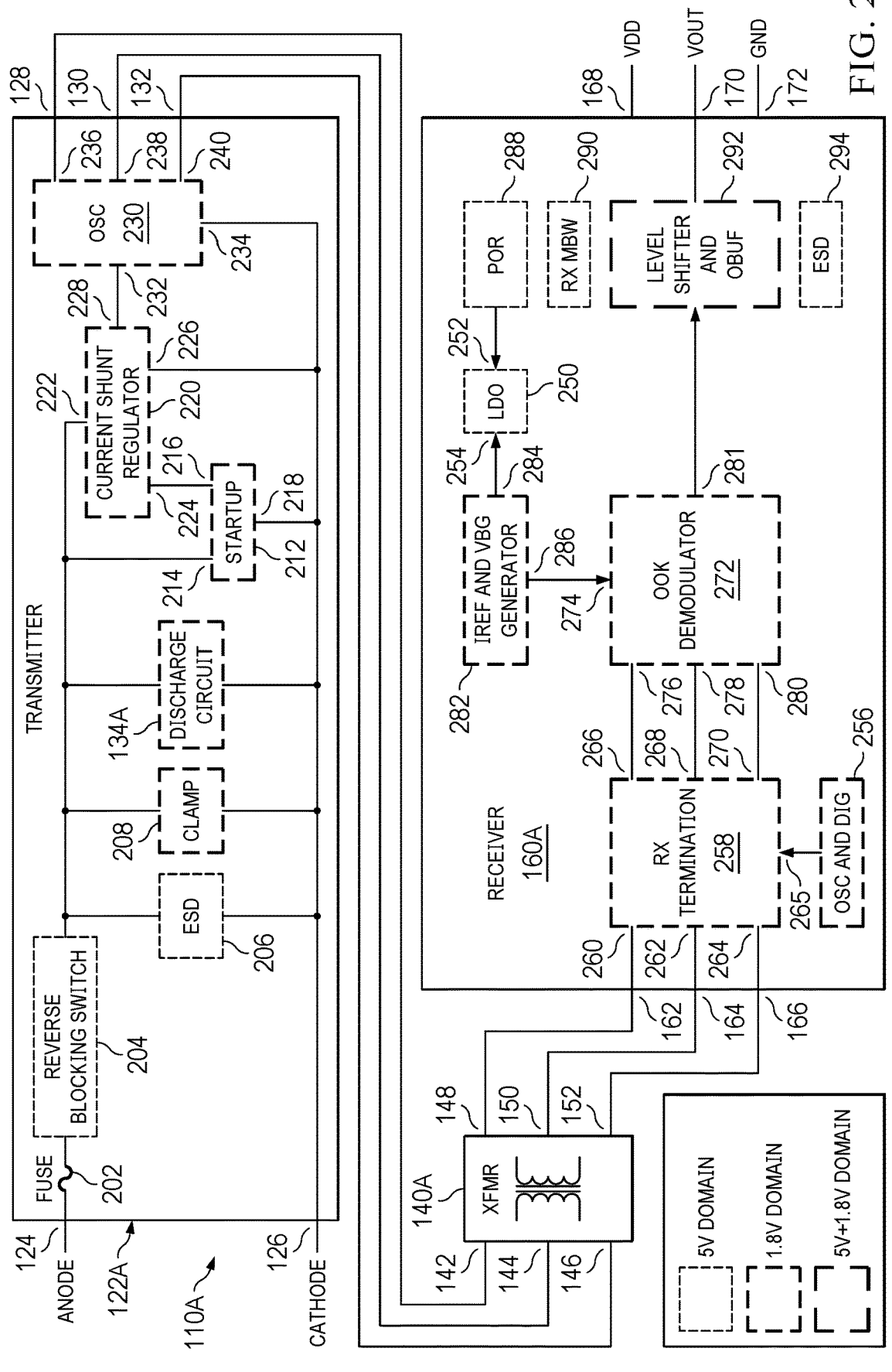
FIG. 2 is a block diagram showing an example optoemulator.

FIG. 2 is a block diagram showing an example optoemu- lator 110A. The optoemulator 110A is an example of the optoemulator 110 in FIG. 1. As shown, the optoemulator 110A includes a transmitter 122A, a transformer 140A, and a receiver 160A. The transmitter 122A is an example of the transmitter 122 in FIG. 1. The transformer 140A is an example of the transformer 140 in FIG. 1. The receiver 160A is an example of the receiver 160 in FIG. 1.

In the example of FIG. 2, the transmitter 122A has the first terminal 124, the second terminal 126, the third terminal 128, the fourth terminal 130, and the fifth terminal 132 described in FIG. 1. The transformer 140A has the first terminal 142, the second terminal 144, the third terminal 146, the fourth terminal 148, the fifth terminal 150, and the sixth terminal 152 described in FIG. 1. The receiver 160A has the first terminal 162, the second terminal 164, the third terminal 166, the fourth terminal 168, the fifth terminal 170, and the sixth terminal 172 described in FIG. 1.

In the example of FIG. 2, the transmitter 122A includes a fuse 202, a reverse blocking switch 204, an electrostatic discharge (ESD) circuit 206, a clamp circuit 208, and a discharge circuit 134A. The discharge circuit 134A is an example of the discharge circuit 134 in FIG. 1. As shown, the transmitter 122A also includes a startup circuit 212, a current shunt regulator 220, and an oscillator 230.

The fuse 202 has a first terminal and a second terminal. The reverse blocking switch 204 has a first terminal and a second terminal. The ESD circuit 206 has a first terminal and a second terminal. The clamp circuit 208 has a first terminal and a second terminal. The discharge circuit 134A has a first terminal and a second terminal. The startup circuit 212 has a first terminal 214, a second terminal 216, and a third terminal 218. The current shunt regulator 220 has a first terminal 222, a second terminal 224, a third terminal 226, and a fourth terminal 228. The oscillator 230 has a first terminal 232, a second terminal 234, a third terminal 236, a fourth terminal 238, and a fifth terminal 240.

As shown, the receiver 160A includes a low dropout regulator (LDO) 250, oscillator and digital circuitry 256, a receiver (RX) termination circuit 258, an on-off keying (OOK) demodulator 272, a reference current (IREF) and bandgap voltage reference (VBG) generator 282, a power- on reset (POR) circuit 288, an RX missing bondwire (MBW) circuit 290, a level shifter and output buffer (OBUF) circuit 292, and an ESD circuit 294.

The LDO 250 has a first terminal 252 and a second terminal 254. The oscillator and digital circuitry 256 has an output. The RX termination circuit 258 has a first terminal 260, a second terminal 262, a third terminal 264, a fourth terminal 265, a fifth terminal 266, a sixth terminal 268, and a seventh terminal 270. The OOK demodulator has a first terminal 274, a second terminal 276, a third terminal 278, a fourth terminal 280, and a fifth terminal 281. The IREF and VBG generator 282 has a first terminal 284 and a second terminal 286. The POR circuit 288 has an output. The level shifter and OBUF circuit 292 has an input and an output. The ESD circuit 294 provides ESD protection for the transmitter 122A. The output. The RX MBW circuit 290 operates to detect faulty or missing bondwires. For examples, such bondwires may be used between the fourth terminal 148 of the transformer 140A and the first terminal 162 of the receiver 160A and/or between the sixth terminal 152 of the transformer 140A and the third terminal 166 of the receiver 160A.

In some examples, the first terminal of the fuse 202 is coupled to the first terminal 124 of the transmitter 122A. In the example of FIG. 2, the first terminal 124 is referred to an anode terminal. The second terminal of the fuse 202 is coupled to the first terminal of the reverse blocking switch 204. The second terminal of the reverse blocking switch 204 is coupled to the first terminals of the ESD circuit 206, the clamp circuit 208, and the discharge circuit 134A. The second terminal of the ESD circuit 206, the clamp circuit 208, and the discharge circuit 134A are coupled to the second terminal 126 of the transmitter 122A. In the example of FIG. 2, the second terminal 126 is referred to a cathode terminal. As shown, the ESD circuit 206, the clamp circuit 208, and the discharge circuit 134A are in parallel between the second terminal of the reverse blocking switch 204 and the second terminal 126 of the transmitter 122A.

The second terminal of the reverse blocking switch 204 is also coupled to the first terminal 214 of the startup circuit 212 and to the first terminal 222 of the current shunt regulator 220. The second terminal 216 of the startup circuit 212 is coupled to the second terminal 224 of the current shunt regulator 220. The third terminal 218 of the startup circuit 212 is coupled to the second terminal 126 of the transmitter 122A. The third terminal 226 of the current shunt regulator 220 is coupled to the second terminal 126 of the transmitter 122A. The fourth terminal 228 of the current shunt regulator 220 is coupled to the first terminal 232 of the oscillator 230. The second terminal 234 of the oscillator 230 is coupled to the second terminal 126 of the transmitter 122A. The third terminal 236 of the oscillator 230 is coupled to the third terminal 128 of the transmitter 122A. The fourth terminal 238 of the oscillator 230 is coupled to the fourth terminal 130 of the transmitter 122A. The fifth terminal 240 of the oscillator 230 is coupled to the fifth terminal 132 of the transmitter 122A.

In some examples, the reverse blocking switch 204 and the ESD circuit 206 are part of a first voltage domain (e.g., a 5V domain) of the transmitter 122A. The clamp circuit 208, the discharge circuit 134A, the startup circuit 212, the current shunt regulator 220, and the oscillator 230 are part of a second voltage domain (e.g., a 1.8V domain) of the transmitter 122A.

The third terminal 128 of the transmitter 122A is coupled to the first terminal 142 of the transformer 140A. The fourth terminal 130 of the transmitter 122A is coupled to the second terminal 144 of the transformer 140A. The fifth terminal 132 of the transmitter 122A is coupled to the third terminal 146 of the transformer 140A. The first terminal 162 of the receiver 160A is coupled to the fourth terminal 148 of the transformer 140A. The second terminal 164 of the receiver 160A is coupled to the fifth terminal 150 of the transformer 140A. The third terminal 166 of the receiver 160A is coupled to the sixth terminal 152 of the transformer 140A.

In the example of FIG. 2, first terminal 252 of the LDO 250 is coupled to the output of the POR circuit 288. The second terminal 254 of the LDO 250 is coupled to the first terminal 284 of the IREF and VBG generator 282. The first terminal 260 of the RX termination circuit 258 is coupled to the first terminal 162 of the receiver 160A. The second terminal 262 of the RX termination circuit 258 is coupled to the second terminal 164 of the receiver 160A. The third terminal 264 of the RX termination circuit 258 is coupled to the third terminal 166 of the receiver 160A. The fourth terminal 265 of the RX termination circuit 258 is coupled to the output of the oscillator and digital circuitry 256. The fifth terminal 266 of the RX termination circuit 258 is coupled to the second terminal 276 of the OOK demodulator 272. The sixth terminal 268 of the RX termination circuit 258 is coupled to the third terminal 278 of the OOK demodulator 272. The seventh terminal 270 of the RX termination circuit 258 is coupled to the fourth terminal 280 of the OOK demodulator 272. The first terminal 274 of the OOK demodulator 272 is coupled to the second terminal 286 of the IREF and VBG generator 282. The fifth terminal 281 of the OOK demodulator 272 is coupled to the input of the level shifter and OBUF circuit 292. The output of the level shifter and OBUF circuit 292 is coupled to the fifth terminal 170 of the receiver 160A.

In some examples, the LDO 250, the POR circuit 288, the RX MBW circuit 290, and the ESD circuit 294 are part of a first voltage domain (e.g., a 5V domain) of the receiver 160A. The oscillator and digital circuitry 256, the RX termination circuit 258, the OOK demodulator 272, and the IREF and VBG generator 282 are part of a second voltage domain (e.g., a 1.8V domain) of the receiver 160A. Also, the level shifter and OBUF circuit 292 is part of a third voltage domain (e.g., a 6.8V domain) of the receiver 160A.

In the example of FIG. 2, the transmitter 122A operates to: receive a current at the first terminal 124; pass the current through the fuse 202 and the reverse blocking switch 204 to generate $V_{bias}$; manage $V_{bias}$ using the ESD circuit 206, the clamp circuit 208, and the discharge circuit 134A; manage startup operations using the startup circuit 212; and generate a transmit signal responsive to $V_{bias}$, the operations of the current shunt regulator 220, and the operations of the oscillator 230. In some examples, the transmit signal is a differential signal provided using the third terminal 128, the fourth terminal 130, and the fifth terminal 132 of the transmitter 122A.

The transformer 140A operates to: receive the transmit signal from the transmitter 122A; and provide a modified transmit signal to the receiver 160A. Relative to the transmit signal provided by the transmitter 122A, the modified transmit signal received by the receiver 160A may vary with regard to voltage level, current level, and/or polarity.

In some examples, the receiver 160A includes various power management circuits such as the POR circuit 288, the IREF and VBG generator 282, and the LDO 250. The receiver 160A may operate based on a voltage supply provided by the LDO 250 to detect the OOK carrier transmitted by the transmitter 122A as either logic 0 or logic 1. The output signal of the OOK demodulator 272 may be in the LDO supply domain. The level shifter and OBUF circuit 292 is used to convert the output signal of the OOK demodulator from LDO voltage supply domain to a VDD supply domain signal. The OBUF operation of the level shifter and OBUF circuit 292 is used to send the output signal to a larger load.

In some examples, the receiver 160A operates to: receive the modified transmit signal; perform mixing operations on the modified transmit signal based on signals provided by the oscillator and digital circuitry 256; use the OOK demodulator 272 to perform OOK demodulation on the mixed signals responsive to IREF and/or VBG from the IREF and VBG generator 282; use the level shifter and OBUF circuit 292 to level shift and buffer the demodulated signals generated by the OOK demodulator 272, resulting in VOUT at the output of the level shifter and OBUF circuit 292; and provide VOUT at the fifth terminal 170 of the receiver 160A. During receiver operations, VDD is used to power the signal output by the level shifter and OBUF circuit 292. As needed, the ESD circuit 294 provides ESD protection.

Figure 3:
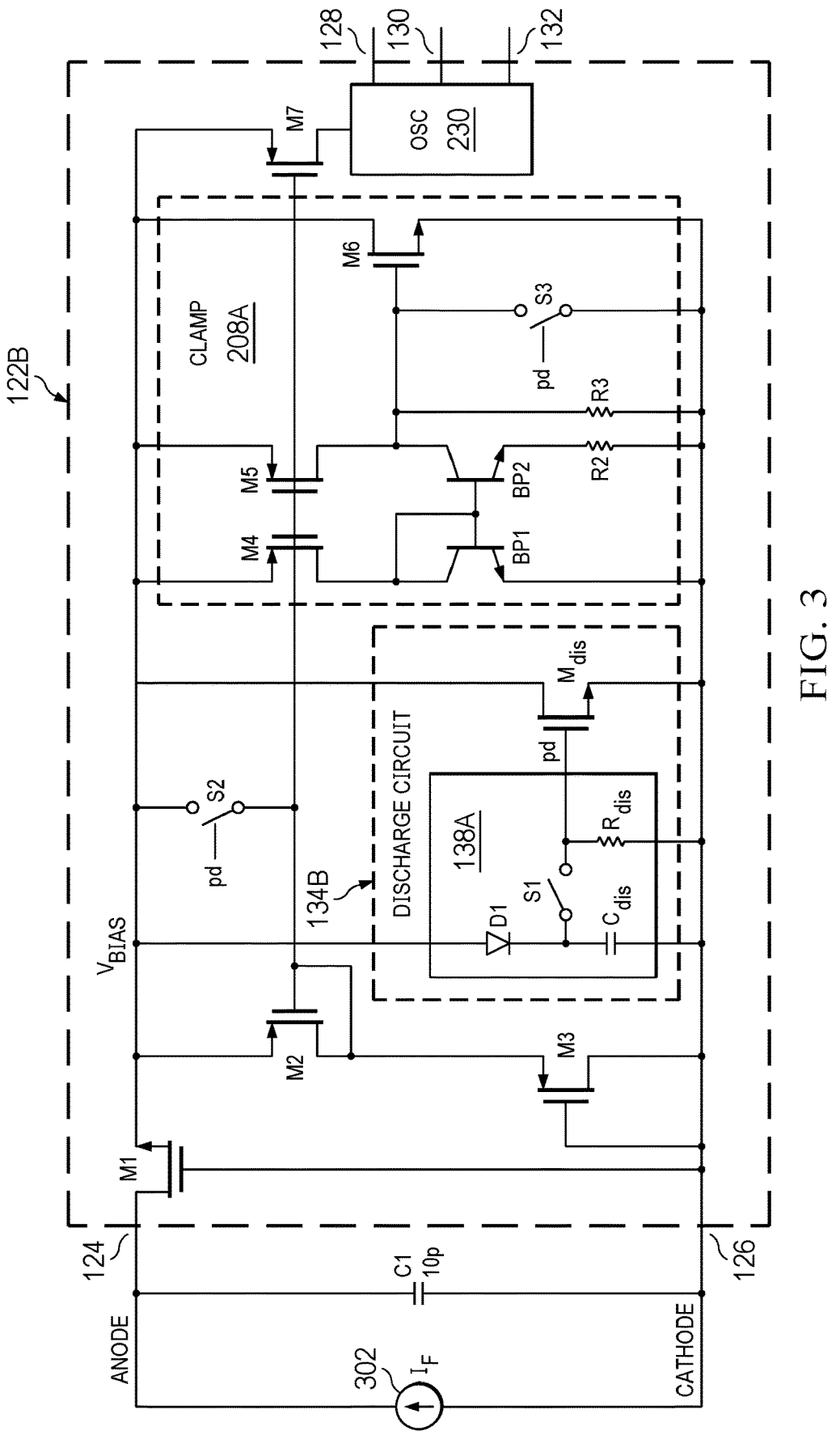
FIG. 3 is a schematic diagram showing part of an example transmitter.

FIG. 3 is a schematic diagram showing part of a transmitter 122B in accordance with an example embodiment. The transmitter 122B is an example of the transmitter 122 in FIG. 1, or the transmitter 122A in FIG. 2. In the example of FIG. 3, the transmitter 122B has the first terminal 124, the second terminal 126, the third terminal 128, the fourth terminal 130, and the fifth terminal 132 described in FIGS. 1 and 2.

As shown, the transmitter 122B includes a discharge circuit 134B, a clamp circuit 208A, the oscillator 230, and transistors M1, M2, M3, and M7. The clamp circuit 208A is an example of the clamp circuit 208 of FIG. 2 in the arrangement shown. The clamp circuit 208A includes transistors M1 to M6, transistors BP1 and BP2, switches S2 and S3, resistors R2 and R3. The discharge circuit 134B is an example of the discharge circuit 134 in FIG. 1, or the discharge circuit 134A in FIG. 2. In some examples, the discharge circuit 134B includes a diode D1, a capacitor $C_{dis}$, a switch S1, a resistor $R_{dis}$, and a transistor $M_{dis}$ in the arrangement shown.

In the example of FIG. 3, the transistors M1, M6, and $M_{dis}$ are implemented by field-effect transistor (FETs) and, in particular, n-channel metal-oxide semiconductor FETs. The switch S1 may be implemented as a FET and, in particular, a p-channel metal-oxide semiconductor FET. The switches S2 and S3 may be implemented as FETs and, in particular, n-channel metal-oxide semiconductor FETs. Also, the M2, M3, M4, M5 are implemented by FETs and, in particular, p-channel metal-oxide semiconductor FETs. As shown, the transistors BP1 and BP2 are implemented by NPN bipolar transistors.

In the example of FIG. 2, the diode D1 has an anode and a cathode. Each of the capacitor $C_{dis}$ and the resistor $R_{dis}$ has a first terminal and a second terminal. Each of the switch S1 and the transistor $M_{dis}$ has a first (current) terminal, a second (current) terminal, and a control terminal. In the example of FIG. 3, the transistor $M_{dis}$ is an example of the discharge switch 136 in FIG. 1. The diode D1, the capacitor $C_{dis}$, the switch S1, and the resistor $R_{dis}$ are components of control circuitry 138A to control the transistor $M_{dis}$ responsive to a control signal (e.g., $I_F$). The control circuitry 138A is an example of the control circuitry 138 in FIG. 1. In some examples, the control circuitry 138A includes additional and/or alternative components.

In the example of FIG. 3, the transmitter 122B is coupled to an external current ($I_F$) source 302 and an external capacitor C1 in parallel between the first terminal 124 and the second terminal 126. The $I_F$ source 302 may be, for example, an external current source coupled between the first terminal 124 and the second terminal 126 of the transmitter 122A. In some examples, the $I_F$ source 302 may be a sensor or sensor output terminals.

In some examples, M1 is an example of the reverse blocking switch 204 in FIG. 2. In the example of FIG. 3, each of the $I_F$ source 302, the capacitor C1, the resistors R2 and R3 has a first terminal and a second terminal. Each of the transistors M1 to M7, the transistors BP1 and BP2, and the switches S2 and S3 have a first current terminal, a second current terminal, and a control terminal.

In the example of FIG. 2, the first terminals of the $I_F$ source 302 and the capacitor C1 are coupled to the first terminal 124 of the transmitter 122B. The second terminals of the $I_F$ source 302 and the capacitor C1 are coupled to the second terminal 126 of the transmitter 122B. The first current terminal of M1 is also coupled to the first terminal 124 of the transmitter 122B. The second current terminal of M1 is coupled to the first current terminal of M2. The control terminal of the M1 is coupled to the second terminal 126 of the transmitter 122B. The second current terminal of M2 is coupled to the first current terminal of M3. The second current terminal of M3 is coupled to the second terminal 126 of the transmitter 122B. The anode of the diode D1 is coupled to the second current terminal of M1. The cathode of the diode D1 is coupled to the first terminal of the capacitor $C_{dis}$. The second terminal of the capacitor $C_{dis}$ is coupled to the second terminal 126 of the transmitter 122B. The cathode of the diode D1 is also coupled to the first current terminal of the switch S1. The second current terminal of the switch S1 is coupled to the first terminal of resistor $R_{dis}$ and to the control terminal of the transistor $M_{dis}$. The second terminal of the resistor $R_{dis}$ is coupled to the second terminal 126 of the transmitter 122B.

The first current terminal of the switch S2 is coupled to the second current terminal of the transistor M1. The second current terminal of the switch S2 is coupled to the control terminals of M2, M4, M5, and M7. The control terminal of the switch S2 is coupled to the control terminal of the transistor $M_{dis}$. The first current terminal of the transistor M4 is coupled to the first terminal 124 of the transmitter 122B. The second current terminal of the transistor M4 is coupled to the first current terminal of the transistor BP1. The second current terminal of the transistor BP1 is coupled to the second terminal 126 of the transmitter 122B.

The first current terminal of the transistor M5 is coupled to the first terminal 124 of the transmitter 122B. The second current terminal of the transistor M5 is coupled to: the first current terminal of the transistor BP2; the first terminal of the resistor R3; and the first current terminal of the switch S3. The second terminal of the resistor R3 and the second current terminal of the switch S3 are coupled to the second terminal 126 of the transmitter 122B. The control terminal of the switch S3 is coupled to the control terminal of the transistor $M_{dis}$. The second current terminal of the transistor BP2 is coupled to the first terminal of the resistor R2. The second terminal of the resistor R2 is coupled to the second terminal 126 of the transmitter 122B. The control terminal of the transistor BP2 is coupled to the control terminal and the first current terminal of the transistor BP1. The first current terminal of the transistor M6 is coupled to the first terminal 124 of the transmitter 122B. The second current terminal of the transistor M6 is coupled to the second terminal 126 of the transmitter 122B. The control terminal of the transistor M6 is coupled to the second current terminal of the transistor M5. The first current terminal of the transistor M7 is coupled to the first terminal 124 of the transmitter 122B. The second current terminal of the transistor M7 is coupled to the oscillator 230.

In the example of FIG. 3, the $I_F$ source 302 charges the capacitor C1. The transmitter 122B operates to: receive the charge on C1 at the first terminal 124; provide $V_{bias}$ responsive to the charge stored on C1 and the operations of M1; use $V_{bias}$ to power the discharge circuit 134A, the clamp circuit 208A, and the oscillator 230; adjust $V_{bias}$ over time based on the operations of the discharge circuit 134B and $I_F$; and use the oscillator 230 to generate a transmit signal responsive to $I_F$. In some examples, the transmit signal generated by the oscillator 230 is a differential signal provided using the third terminal 128, the fourth terminal 130, and the fifth terminal 132 of the transmitter 122B. In some examples, M2 and M3 set the value of $V_{bias}$, and operate as part of a current mirror with M7. The clamp circuit 208A operates to maintain $V_{bias}$ below an upper threshold, above a lower threshold, or both. In the example of FIG. 3, the control terminal of the transistor $M_{dis}$ is sometimes referred to herein as a power down (pd) node. With control circuitry 138A, the pd node is charged to perform $V_{bias}$ high-to-low transitions responsive to $I_F$.

In the example of FIG. 3, the discharge circuit 134B operates to quickly discharge $V_{bias}$ via $M_{dis}$ responsive to a control signal (e.g., $I_F$). In some examples, the control circuitry 138A of the discharge circuit 134B operates to: perform first voltage level adjustments of the control circuitry 138A responsive to the control signal having a first state (e.g., a logical "1" state); control the discharge switch responsive to the control signal having a second state (e.g., a logical "0" state) and the adjusted voltage levels; and perform second voltage level adjustments of the control circuitry 138A after a discharge interval is complete. The operations of the discharge circuit 134B are repeated as needed to control rising and falling edges of a target signal. With the discharge circuit 134B, $V_{bias}$ jitter is reduced and the speed of $V_{bias}$ transitions (e.g., high-to-low transitions) is increased. These improvements improve the data rate and signal quality of communication circuitry such as the transmitter 122B.

Figure 4:
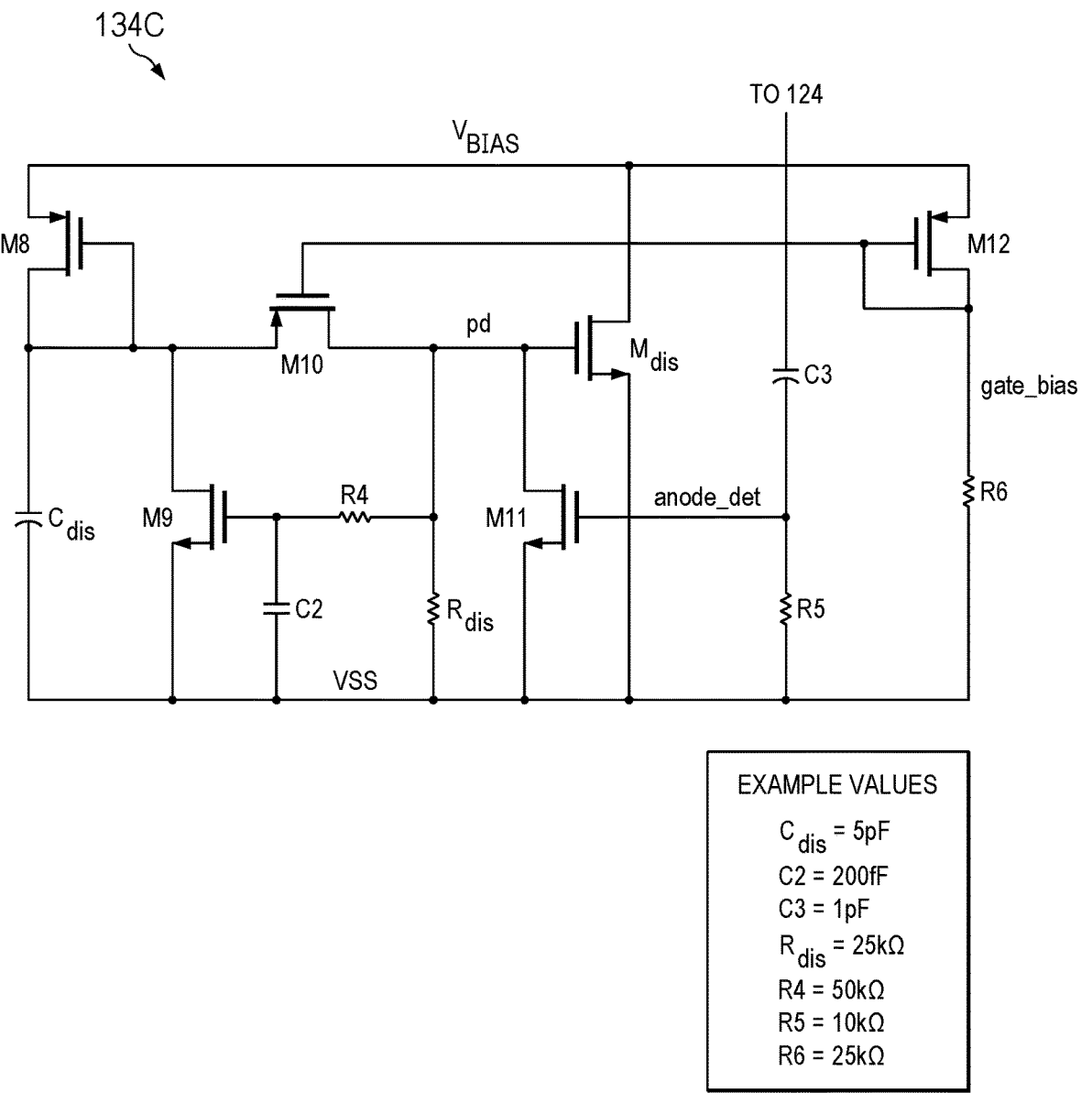
FIG. 4 is a schematic diagram showing an example discharge circuit.

FIG. 4 is a schematic diagram showing an example discharge circuit 134C. The discharge circuit 134C is an example of the discharge circuit 134 in FIG. 1, the discharge circuit 134A in FIG. 2, or the discharge circuit 134B in FIG. 3. In the example of FIG. 4, the discharge circuit 134C includes the transistor $M_{dis}$, the capacitor $C_{dis}$, and the resistor $R_{dis}$ described for the discharge circuit 134B of FIG. 3. Relative to the discharge circuit 134B of FIG. 3, the discharge circuit 134C of FIG. 4 replaces the diode D1 with a transistor M8 and replaces the switch S1 with transistor M10. As shown, the discharge circuit 134C also includes transistors M9, M11, and M12, resistors R4, R5, and R6, and capacitors C2 and C3 in the arrangement shown.

In the example of FIG. 4, the transistors M8, M10, and M12 are implemented by FETs and, in particular, p-channel metal-oxide semiconductor FETs. The transistors M9, M11, and $M_{dis}$ are implemented by FETs and, in particular, n-channel metal-oxide semiconductor FETs.

In the example of FIG. 4, each of the transistors $M_{dis}$ and M8 to M12 has a first current terminal, a second current terminal, and a control terminal. Also, each of the resistors $R_{dis}$ and R4 to R6 and capacitors $C_{dis}$. C2, and C3 has a first terminal and a second terminal. In some examples, the first current terminal of M8 is coupled to a $V_{bias}$ source. Examples of a $V_{bias}$ source include the second terminal of the reverse blocking switch 204 in FIG. 2, or the second current terminal of M1 in FIG. 3. The second current terminal of M8 is coupled to the first terminal of the capacitor $C_{dis}$ and to the first current terminal of M10. The second terminal of the capacitor $C_{dis}$ is coupled to a voltage supply source (VSS) terminal. In some examples, the VSS terminal may be a ground terminal. As shown, the first current terminal of the transistor $M_{dis}$ is coupled to the $V_{bias}$ source. The second current terminal of the transistor $M_{dis}$ is coupled to the VSS terminal. The control terminal of the transistor $M_{dis}$ is coupled to the second current terminal of M10 and to the first terminal of the resistor $R_{dis}$. The second terminal of the resistor $R_{dis}$ is coupled to the VSS terminal. This arrangement for the transistor M8, M10, and $M_{dis}$, the capacitor $C_{dis}$, and the resistor $R_{dis}$ of the discharge circuit 134C is similar to the arrangement for the diode D1, the switch S1, the transistor $M_{dis}$, the capacitor $C_{dis}$, and the resistor $R_{dis}$ of the discharge circuit 134B in FIG. 3.

Relative to the discharge circuit 134B in FIG. 3, the discharge circuit 134C includes additional control circuitry components such as the transistor M9, the capacitor C2, the resistor R4, the transistor M11, the capacitor C3, the transistor M12, and the resistor R6 are additional components. These additional control circuitry components for the discharge circuit 134C enable faster discharge of $V_{bias}$ via $M_{dis}$ and reduced $V_{bias}$ jitter.

As shown, the first current terminal of M9 is coupled to the first terminal of $C_{dis}$. The second current terminal of M9 is coupled to VSS terminal. The control terminal of the transistor M9 is coupled to the first terminal of the capacitor C2 and to the first terminal of the resistor R4. The second terminal of the capacitor C2 is coupled to the VSS terminal. The second terminal of the resistor R4 is coupled to the control terminal of the transistor $M_{dis}$. The first current terminal of the transistor M11 is coupled to the control terminal of the transistor $M_{dis}$. The second current terminal of the transistor M11 is coupled to the VSS terminal. The control terminal of the transistor M11 is coupled to the first terminal of resistor R5 and to the second terminal of the capacitor C3. The first terminal of the capacitor C3 is coupled to an anode terminal such as the first terminal 124 of the transmitter 122 in FIG. 1, or the first terminal 124 of the transmitter 122A in FIG. 2. The second terminal of the resistor R5 is coupled to the VSS terminal. As shown, the control terminal of M10 is coupled to the control terminal of the transistor M12, to the second current terminal of M12, and to the first terminal of the resistor R6. The first current terminal of the transistor M12 is coupled to the $V_{bias}$ source. Without limitation, example values for the discharge circuit 134C include: Cdis=5 pF; C2=200 fF; C3=1 pF; $R_{dis}$=25 kΩ; R4=50 kΩ; R5=10 kΩ; and R6=25 kΩ. In some examples, $R_{dis}$ has a value of 25 kΩ or less.

In the example of FIG. 4, the discharge circuit 134C operates to quickly discharge $V_{bias}$ via the transistor $M_{dis}$ responsive to a control signal (e.g., $I_F$). In some examples, the control circuitry of the discharge circuit 134C includes all of the components shown except the transistor $M_{dis}$. The control circuitry operates to: perform first voltage level adjustments responsive to the control signal having a first state (e.g., a logical "1" state); control the transistor $M_{dis}$ responsive to the control signal having a second state (e.g., a logical "0" state) and the adjusted voltage levels; and perform second voltage level adjustments after a discharge interval is complete. The operations of the discharge circuit 134C are repeated as needed to control rising and falling edges of $V_{bias}$. With the discharge circuit 134B, $V_{bias}$ jitter is reduced and the speed of $V_{bias}$ transitions (e.g., high-to-low transitions) is increased. These improvements improve the data rate and signal quality of communication circuitry such as the transmitter 122B.

In the example of FIG. 4, the gate of M10 is connected to the transistor M12 and R6. When $V_{bias}$ goes low, the voltage across R6 immediately becomes zero and the transistor M10 is turned on. As a result, the pd node rises quickly, which turns on the transistor $M_{dis}$ to discharge $V_{bias}$. To ensure the pd node does not remain high before the next rising pulse, the transistor M11 is turned on to discharge the pd node. The control terminal of the transistor M11 is controlled quickly responsive to $I_F$ using the capacitor C3 and the resistor R5.

Figure 5A:
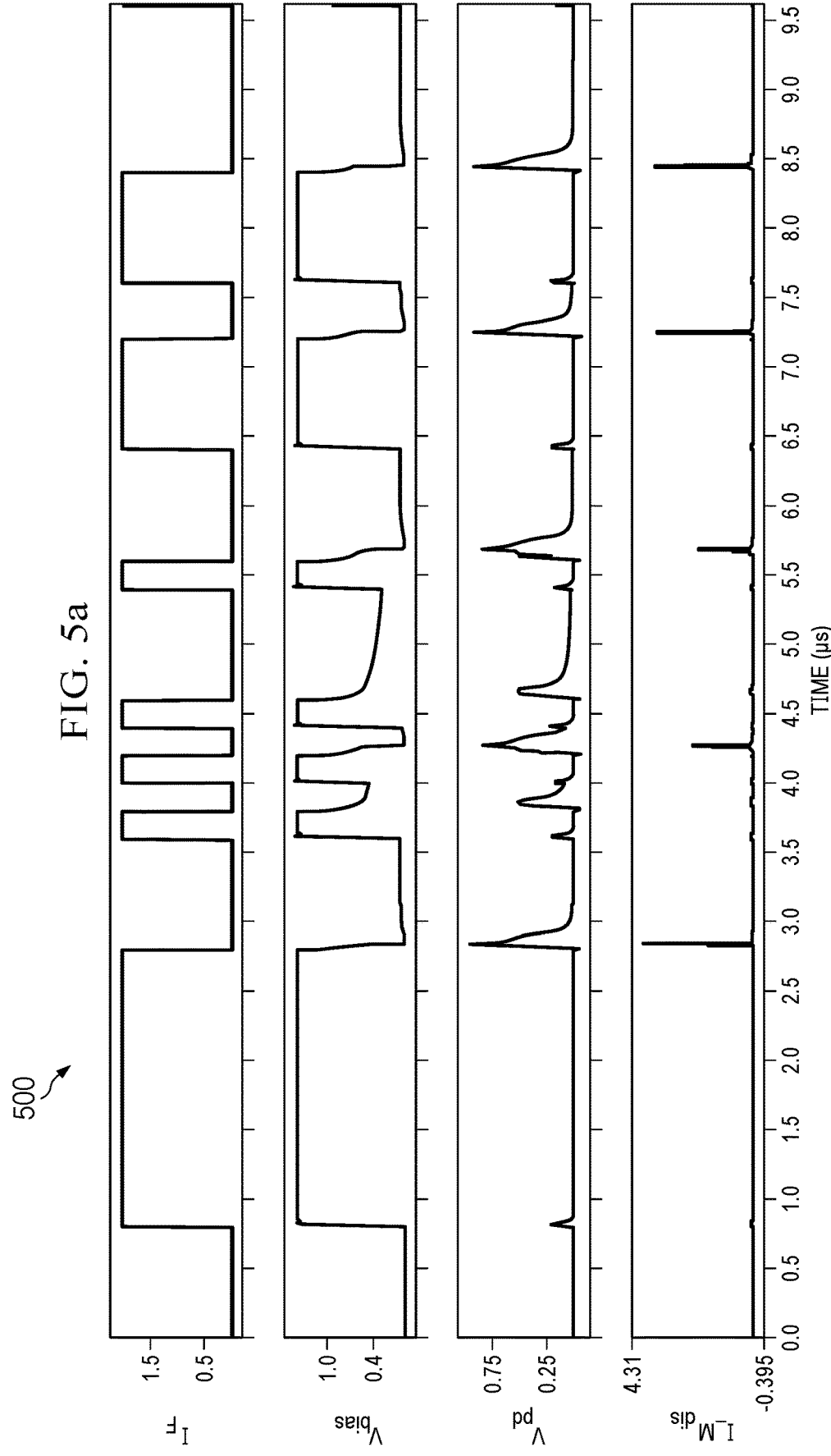
FIG. 5a is a graph showing signals related to a discharge circuit not consistent with examples in the present description.

FIG. 5a is a graph showing signals related to a discharge circuit not consistent with examples in the present description. The represented signals of graph 500 include $I_F$, $V_{bias}$, $V_{pd}$, and I_$M_{dis}$, where $V_{pd}$ is the voltage at the pd node (the control terminal of $M_{dis}$), and I_$M_{dis}$ is the current through the transistor $M_{dis}$. As shown in graph 500, $V_{bias}$ generally follows the pattern of $I_F$. However, the falling edges of $V_{bias}$ are too gradual and do not always reach a target low value. Also, the rising edges of $V_{bias}$ have some overshoot and related jitter. The issues with $V_{bias}$ are due to inconsistent values of $V_{pd}$ over time. Likewise, I_$M_{dis}$ suffers from inconsistency due to the variance in $V_{pd}$.

Figure 5B:
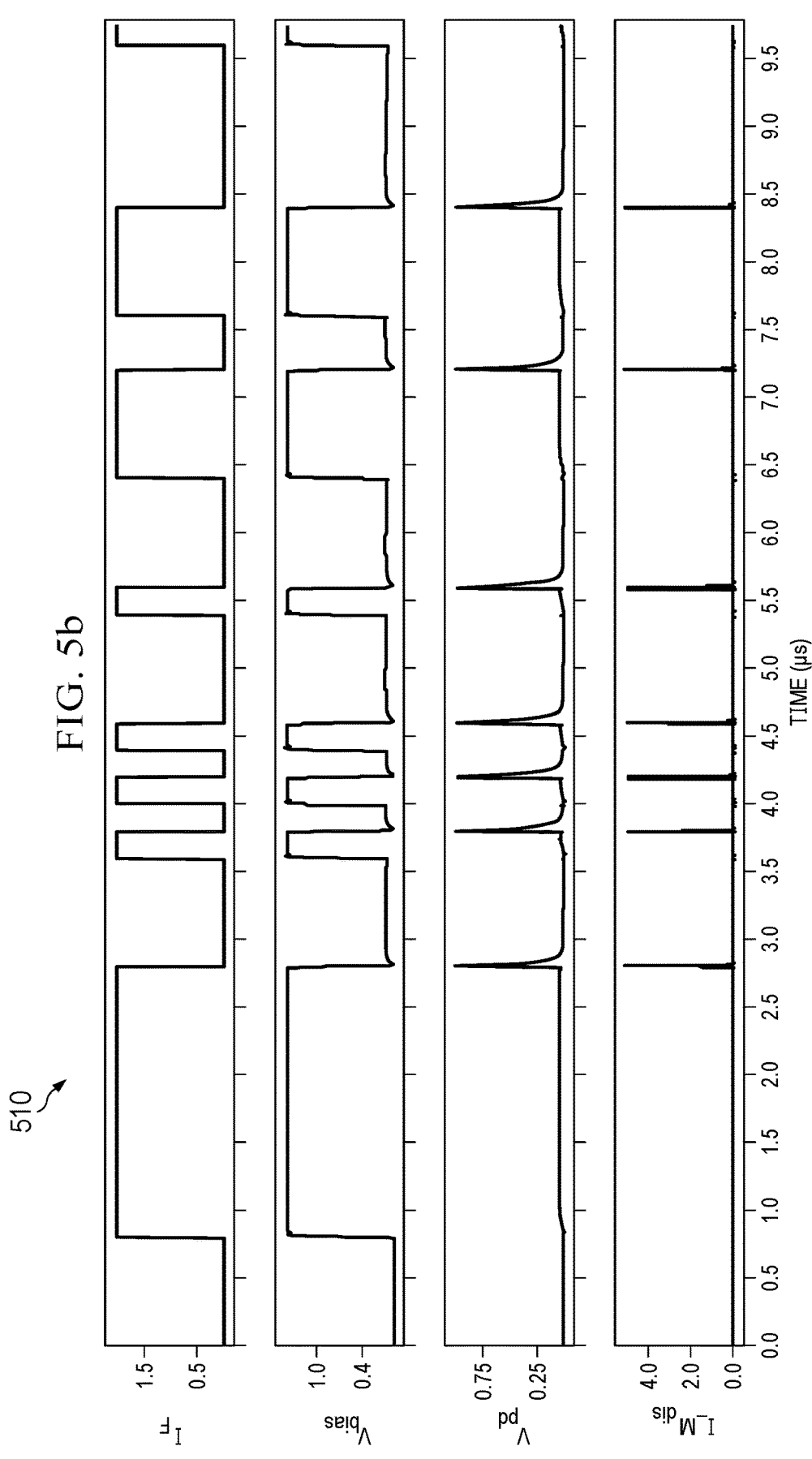
FIG. 5b is a graph showing signals related to an example discharge circuit consistent with examples in the present description.

FIG. 5$b$ is a graph 510 showing signals related to a discharge circuit in accordance with another example embodiment. The represented signals of graph 510 include $I_F$, $V_{bias}$, $V_{pd}$, and I_$M_{dis}$. As shown in graph 510, $V_{bias}$ closely follows the pattern of $I_F$ for both rising and falling edges. The improvement in $V_{bias}$ is due to improved control of $V_{pd}$ over time. Likewise, the consistency of I_$M_{dis}$ is improved. With a discharge circuit as described herein, $V_{bias}$ jitter is reduced and the speed of $V_{bias}$ transitions (e.g., high-to-low transitions) is increased. These improvements improve the data rate and signal quality of communication circuitry such as the transmitter 122B, a related optoemulator (e.g., the optoemulator 110 in FIG. 1, or the optoemulator 110A in FIG. 2), and/or a related system (e.g., the system 100 in FIG. 1).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

US 12,671,414 B2

13

The invention claimed is:

1. A circuit comprising:
a first transistor having a current terminal and a first control terminal;
a capacitor having a capacitor terminal coupled to the current terminal of the first transistor;
a second transistor having a first current terminal, a second current terminal, and a second control terminal, the first current terminal of the second transistor coupled to the capacitor terminal, and the second current terminal of the second transistor coupled to the first control terminal;
a first resistor having a resistor terminal coupled to the second control terminal;
a second resistor having a resistor terminal coupled to the first control terminal; and
a third transistor having a current terminal and a third control terminal, the current terminal of the third transistor coupled to the first control terminal;
a fourth transistor having a current terminal and a fourth control terminal, the current terminal of the fourth transistor coupled to the capacitor terminal; and
a third resistor having a first resistor terminal and a second resistor terminal, the first resistor terminal of the third resistor coupled to the fourth control terminal, and the second resistor terminal of the third resistor coupled to the first control terminal.

2. The circuit of claim 1, wherein the capacitor is a first capacitor, and the circuit further comprises a second capacitor having a capacitor terminal coupled to the fourth control terminal.

3. The circuit of claim 2, further comprising a fifth transistor having a current terminal and a fifth control terminal, the capacitor terminal of the first capacitor coupled to the fifth control terminal and the current terminal of the fifth transistor.

4. The circuit of claim 3, further comprising a sixth transistor having a current terminal and a sixth control terminal, the second control terminal coupled to the sixth control terminal and the current terminal of the sixth transistor.

5. The circuit of claim 4, further comprising:
a third capacitor having a capacitor terminal coupled to the third control terminal; and
a fourth resistor having a resistor terminal coupled to the third control terminal.

6. The circuit of claim 4, wherein the circuit is part of an optoemulator transmitter.

7. A circuit comprising:
transmitter circuitry;
a transformer coupled to the transmitter circuitry; and
a discharge circuit coupled to the transmitter circuitry, the discharge circuit including:
a first transistor having a current terminal and a first control terminal;
a capacitor having a capacitor terminal coupled to the current terminal;
a second transistor having a first current terminal, a second current terminal, and a second control terminal, the first current terminal of the second transistor coupled to the capacitor terminal, and the second current terminal of the second transistor coupled to the first control terminal;
a resistor having a resistor terminal coupled to the second control terminal

14 a second resistor having a resistor terminal coupled to the first control terminal; and
a third transistor having a current terminal and a third control terminal, the current terminal of the third transistor coupled to the first control terminal;
a fourth transistor having a current terminal and a fourth control terminal, the current terminal of the fourth transistor coupled to the capacitor terminal; and
a third resistor having a first resistor terminal and a second resistor terminal, the first resistor terminal of the third resistor coupled to the fourth control terminal, and the second resistor terminal of the third resistor coupled to the first control terminal.

8. The circuit of claim 7, wherein the capacitor is a first capacitor, and the discharge circuit further comprises a second capacitor having a capacitor terminal coupled to the fourth control terminal.

9. The circuit of claim 8, further comprising a fifth transistor having a current terminal and a fifth control terminal, the capacitor terminal of the first capacitor coupled to the fifth control terminal and the current terminal of the fifth transistor.

10. The circuit of claim 9, further comprising a sixth transistor having a current terminal and a sixth control terminal, the second control terminal coupled to the sixth control terminal and the current terminal of the sixth transistor.

11. The circuit of claim 10, further comprising:
a third capacitor having a capacitor terminal coupled to the third control terminal; and
a fourth resistor having a resistor terminal coupled to the third control terminal.

12. The circuit of claim 7, wherein the second resistor has a value of 25 kΩ or less.

13. The circuit of claim 7, wherein the transmitter circuitry includes:
a clamp circuit in parallel with the discharge circuit;
a startup circuit in parallel with the discharge circuit;
a current shunt regulator in parallel with the discharge circuit, the current shunt regulator having a current shunt regulator output; and
an oscillator coupled to the current shunt regulator output.

14. A circuit comprising:
a discharge switch; and
control circuitry coupled to the discharge switch and configured to:
perform first voltage level adjustments of the control circuit responsive to a control signal having a first state;
control the discharge switch responsive to the control signal having a second state and the adjusted voltage levels; and
perform second voltage level adjustments of the control circuit after a discharge interval is complete.

15. The circuit of claim 14, wherein the control circuitry includes a capacitor, a first control switch, and a second control switch, the first voltage level adjustments include charging the capacitor via the first control switch, and the second voltage level adjustments include discharging the capacitor via the second control switch.

16. The circuit of claim 15, wherein the discharge switch has a control terminal, the control circuitry includes a third control switch, and the second voltage level adjustments include discharging charge at the control terminal via the third control switch.

* * * * *